US006281037B1

(12) United States Patent
Heera et al.

(10) Patent No.: US 6,281,037 B1
(45) Date of Patent: Aug. 28, 2001

(54) METHOD FOR THE TARGETED PRODUCTION OF N-TYPE CONDUCTIVE AREAS IN DIAMOND LAYERS BY MEANS OF ION IMPLANTATION

(75) Inventors: Viton Heera, Dresden; Wolfgang Skorupa, Weixdorf, both of (DE)

(73) Assignee: Forschungszentrum Rossendorf E.V., Schoenfeld-Weissig (DE)

( * ) Notice: Subject to any disclaimer, the term of this patent is extended or adjusted under 35 U.S.C. 154(b) by 0 days.

(21) Appl. No.: 09/402,497

(22) PCT Filed: Jul. 10, 1998

(86) PCT No.: PCT/DE98/01928

§ 371 Date: Dec. 14, 1999

§ 102(e) Date: Dec. 14, 1999

(87) PCT Pub. No.: WO99/04418

PCT Pub. Date: Jan. 28, 1999

(30) Foreign Application Priority Data

Jul. 14, 1997 (DE) .............................. 197 30 083

(51) Int. Cl.$^7$ .................................. H01L 21/00
(52) U.S. Cl. .......................... 438/105; 438/514; 438/528
(58) Field of Search ..................... 438/105, 514, 438/527, 528, 529, 530

(56) References Cited

U.S. PATENT DOCUMENTS 5,298,106   3/1994   Kabaloff et al. .
5,382,809 * 1/1995   Nishibayashi et al. .
5,532,495 * 7/1996   Bloomquist et al. .
5,538,911 * 7/1996   Yamazaki .
5,994,208 * 11/1999  Prins .

FOREIGN PATENT DOCUMENTS 7-115191   5/1992   (JP) .

OTHER PUBLICATIONS

R. Kalish, Ion Implantation in Diamond and Diamond Films: Doping, Damage Effects and their Applications, Applied Surface Science 117/118 (1997) 558.
Fang et al., "Ohmic Contacts Formed by Ion Mixing in the Si–Diamond System", IEEE Trans on Electron Devices, Sep. 1989, pp 1783–1786.

* cited by examiner

Primary Examiner—Kevin M. Picardat
(74) Attorney, Agent, or Firm—Jordan and Hamburg LLP

(57) ABSTRACT

The invention relates to the production of semiconductor elements made of diamond, diamond layers and diamond-like layers, which are doped using the ion implantation method and on which N-type conductive areas are also placed. According to the invention, silicon at a concentration of more than 0.1 atom % is implanted in the lateral and depth areas to be doped, in addition to the elements of the fifth main group known per se which are used in doping. The silicon can be implanted before or after the elements of the fifth main group are applied to the diamond substrate or in a step comprising both. When silicon is implanted after the ions of the elements of the fifth main group, regeneration can be carried out after each implantation or after the second implantation.

10 Claims, No Drawings

METHOD FOR THE TARGETED PRODUCTION OF N-TYPE CONDUCTIVE AREAS IN DIAMOND LAYERS BY MEANS OF ION IMPLANTATION

FIELD OF THE INVENTION

The invention relates to the production of semiconductor components of diamonds, diamond layers and diamond-like layers, which are doped by means of ion implantation and in which n-conducting areas are also introduced.

BACKGROUND OF THE INVENTION

It is generally known from semiconductor technology that silicon and silicon carbides can be doped by means of ion implantation with elements of the fifth main group and that n-conducting areas can be produced in this way. The efforts, to use this method for doping diamonds, were unsuccessful. Alterative methods for doping with, for example, lithium or sodium, also did not lead to a satisfactory result (R. Kalish, Ion Implantation in Diamond and Diamond Films: Doping, Damage Effects and their Applications, Applied Surface Science 117/118 (1997)558).

SUMMARY OF THE INVENTION

It is therefore an object of the invention to ensure a layer, which satisfies the respective requirements with regard to n-conductivity, in diamonds, diamond layers and diamond-like layers by means of ion implantation.

The starting materials for the invention are diamonds, diamond layers and diamond-like layers, into which elements of the fifth main group are introduced by means of ion implantation and which are annealed. Pursuant to the invention, silicon is implanted in addition to the elements of the fifth main group in the lateral and deep region, which is to be doped, in a concentration of more than 0.1 atom percent. The silicon can be implanted in the diamond substrate before or after the introduction of the elements of the fifth main group or in one process step together with this introduction. If the silicon is implanted after the ions of the elements of the fifth main group are introduced, the annealing can be carried out after each implantation or only once after the second implantation.

DETAILED DESCRIPTION OF THE INVENTION

The advantages of the invention consist therein that, due to the complete or partial conversion of diamond areas into silicon carbide, the deep donor states of the nitrogen ($E_c$-1.7 eV) become flat and, with that, electrically active donor states ($E_c$-0.08 ... 0.14 eV) in the diamond. In addition, the graphite portions in the diamond, which are caused by implantation damage and worsen the semiconducting properties, are reduced. Because of the different energy gaps, hetero pn transitions are formed between the $Si_xC_{1-x}$ areas (3C—SiC: $E_g$=2.3 eV) and diamond areas ($E_g$=5.5 eV), which have a series of advantages over homo pn transitions, such as a lower electron hole recombination rate. With that, a higher current amplification and a higher limiting frequency are reached.

The invention is described in greater detail below by means of two examples.

EXAMPLE 1

A p-conducting diamond layer, doped with boron during the deposition and having a minimum thickness of 1 μm, is implanted in an area of 5×5 mm$^2$ at a temperature of 600EC with silicon ions (ion energy of 50 keV, an ion dose of 1×10$^{18}$ cm$^{-2}$) for the synthesis of silicon carbide and subsequently with nitrogen ions (ion energy of 20 keV and an ion dose of 1×10$^{15}$ cm$^{-2}$) for n-doping. After the sample is annealed for 10 minutes at 1700EC, an approximately 50 nm thick n-doped silicon carbide layer, with a hetero pn transition to the diamond substrate, is formed in the implanted region.

EXAMPLE 2

A natural diamond with insulating properties (Type IIa) is implanted at 1000EC initially with boron ions (ion energy of 50 keV and an ion dose of 1×10$^{16}$ cm$^{-2}$), then with nitrogen ions (ion energy of 30 keV and an ion dose of 5×10$^{15}$ cm$^{-2}$) and silicon ions (ion energy of 50 keV and an ion dose of 5×10$^{17}$ cm$^{-2}$). After the sample is annealed for 10 minutes at 1700EC, a pn transition between the n-conducting surface layer, which is partially converted into silicon carbide, and the buried p-conducting layer, is formed at a depth of about 50 nm.

What is claimed is:

1. A method for the targeted production of n-conducting areas in diamonds, diamond layers and diamond-like layers, comprising introducing ions of elements of the fifth main group and silicon ions by ion implantation, in the lateral and deep region, which is to be doped, in a concentration of more than 0.1 atom percent, to produce ion implanted diamonds, diamond layers and diamond-like layers, and thermally annealing the ion implanted diamonds, diamond layers and diamond-like layers.

2. The method of claim 1, comprising introducing the elements of the fifth main group and the silicon, respectively, in consecutive order by an ion implantation process, into diamonds, diamond layers and diamond-like layers.

3. The method of claim 1 or 2, comprising introducing the elements of the fifth main group and the silicon jointly by an ion implantation process, into diamonds, diamond layers and diamond-like layers.

4. The method of claim 1 or 2, wherein the thermal annealing is carried out after each ion implantation.

5. The method of claim 1 or 2, wherein the thermal annealing is carried out after a second ion implantation.

6. The method of claim 1 wherein the diamond layer to be treated is a p-conducting diamond layer doped with boron.

7. The method of claim 1 wherein the elements of the fifth main group comprise nitrogen.

8. The method of claim 6 comprising sequentially introducing silicon and then nitrogen by ion implantation into the boron doped diamond layer.

9. The method of claim 6 comprising introducing silicon and nitrogen ions by ion implantation into the boron doped diamond layer.

10. A material produced by the process of claim 1 that is selected from the group consisting of diamond, diamond layers and diamond-like layers that comprise at least one n-conducting area.

* * * * *